United States Patent
Kaushal et al.

(10) Patent No.: US 7,342,244 B2
(45) Date of Patent: Mar. 11, 2008

(54) SPINTRONIC TRANSISTOR

(75) Inventors: Sanjeev Kaushal, San Jose, CA (US);
Kenji Sugishima, Setagaya-ku (JP);
Swaroop Ganguly, Knoxville, TN (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/488,752

(22) Filed: Jul. 19, 2006

(65) Prior Publication Data
US 2008/0017843 A1 Jan. 24, 2008

(51) Int. Cl.
*H01L 29/06* (2006.01)
*H01L 31/00* (2006.01)

(52) U.S. Cl. .................. 257/24; 257/14; 257/E43.001; 257/421; 438/624; 365/158

(58) Field of Classification Search ........ 257/421–427, 257/14, E43.001–E43.007, E21.665
See application file for complete search history.

(56) References Cited

U.S. PATENT DOCUMENTS

| | | | | |
|---|---|---|---|---|
| 4,939,563 | A * | 7/1990 | Fang et al. | 257/423 |
| 5,654,566 | A * | 8/1997 | Johnson | 257/295 |
| 5,989,963 | A * | 11/1999 | Luning et al. | 438/289 |
| 6,482,729 | B2 * | 11/2002 | Ohno et al. | 438/602 |
| 6,744,086 | B2 * | 6/2004 | Daughton et al. | 257/295 |
| 2004/0041217 | A1 * | 3/2004 | Lee et al. | 257/414 |
| 2004/0178460 | A1 * | 9/2004 | Lee et al. | 257/421 |
| 2005/0282379 | A1 * | 12/2005 | Saito et al. | 438/624 |

OTHER PUBLICATIONS

Yeo et al., "Nanoscale Ultra Thin Body Silicon on insulator P-MOSFET with a SiGe/Si Heterostructure Channel", IEEE Electron Device Letters, vol. 21, No. 4, Apr. 2000, pp. 161-163.*
G. A. Prinz, "Hybrid Ferromagnetic-Semiconductor Structures", Science, vol. 250, 1990, pp. 1092-1097.*
Wolf et al., "Spintronics: A Spin Based Electronics Vision for the Future", Science, vol. 294, 2001, pp. 1488-1495.*
A. T. Filip, "Towards All Electrical Spin Injection and Detection in GaAs in a Lateral Geometry", Journal of Superconductivity: Incorporating Novel Magnetism (© 2005), Springer Science + Business Media, Inc., pp. 1-6.

(Continued)

*Primary Examiner*—Jerome Jackson
*Assistant Examiner*—Jami M Valentine
(74) *Attorney, Agent, or Firm*—Oblon, Spivak, McClelland, Maier & Neustadt, P.C.

(57) ABSTRACT

A semiconductor device including: a substrate comprising silicon; a channel region formed on the substrate; a spin injector formed on the substrate at a first side of the channel region and configured to diffuse a spin-polarized current into the channel region; a spin detector formed on the substrate at a second side of the channel region and configured to receive the spin polarized current from the channel region; and a gate formed on the substrate in an area of the channel region.

19 Claims, 8 Drawing Sheets

OTHER PUBLICATIONS

E. I. Rashba, "Theory of Electrical Spin Injection: Tunnel Contacts as a Solution of the Conductivity Mismatch Problem", The American Physical Society, Physical Review B, vol. 62, No. 24, Dec. 15, 2000-II, pp. R16 267-R16 270.

Daniel Connelly, et al., "A New Route to Zero-Barrier Metal Source/Drain MOSFETs", IEEE Transactions on Nanotechnology, vol. 3, No. 1, Mar. 2004, pp. 98-104.

C. Wang, et al., "Sub-40 nm PtSi Schottky Source/Drain Metal-Oxide- Semiconductor Field-Effect Transistors", Applied Physics Letters, vol. 74, No. 8, Feb. 22, 1999, American Institute of Physics, pp. 1174-1176.

A. Fert, et al., Conditions for Efficient Spin Injection From a Ferromagnetic Metal into a Semiconductor, Physical Review B, vol. 64, 184420, 2001 The American Physical Society, pp. 184420-1-184420-9.

T.M. Maffitt, et al., "Design Considerations for MRAM", IBM J. Res. Dev., vol. 50, No. 1, Jan. 1, 2006, pp. 25-39.

Satoshi Sugahara, et al., "A Spin Metal-Oxide-Semiconductor Field-Effect Transistor Using Half-Metallic-Ferromagnet Contacts for the Source and Drain", Applied Physics Letters, vol. 84, No. 13, Mar. 29, 2004, American Institute of Physics, pp. 2307-2309.

* cited by examiner

- condition for efficient spin injection $$r_N \cdot (\iota_N/\lambda_N) \ll r_C \ll r_N \cdot (\lambda_N/\iota_N)$$

Subscript N: non-magnetic semiconductor region $\iota_N$ (channel) length $\lambda_N$ spin diffusion length $$r_N = \frac{\lambda_N}{\sigma_N}$$

$\sigma_N$ conductivity $r_C$ tunnel barrier contact resistance $\iota_N \sim 50\text{nm}$ $\lambda_N \sim 1000\text{nm}$ → $0.05 r_N \ll r_C \ll 20 \cdot r_N$ → $0.5 r_N < r_C < 2 r_N$ design rule tunnel barrier thickness:

$0.5 r_N^{on} < r_C < 2 r_N^{on}$ ▷ satisfied for ON state $r_N^{off} \approx 100 \cdot r_N^{on}$ ▷ not satisfied for OFF state

*Fig. 7*

SPINTRONIC TRANSISTOR

BACKGROUND OF THE INVENTION

1. Field of the Invention

The present invention relates to a semiconductor device and more particularly to a transistor with a spin-polarized current passing through a channel region.

2. Description of the Related Art

The present invention includes the use of various technologies referenced and described in the documents identified in the following LIST OF REFERENCES, which are cited throughout the specification by the corresponding reference number in brackets:

LIST OF REFERENCES

[1] A. T. Filip, et al., Toward All Electrical Spin Injection and Detection in GaAs in a Lateral Geometry, Journal of Superconductivity: Incorporating Novel Magnetism, 2005.
[2] E. I. Rashba, Theory of Electrical Spin Injection: Tunnel Contacts as a Solution of the Conductivity Mismatch Problem, Physical Review A, Vol. 62, No. 24, 2000.
[3] D. Connelly, et al., A new Route to Zero-Barrier Metal Source/Drain MOSFETs, IEEE Transactions on Nanotechnology, Vol. 3, No. 1, March 2004.
[4] C. Wang, et al., Sub-40 nm PtSi Schottky Source/Drain Metal-Oxide-Semiconductor Field-Effect Transistors, Applied Physics Letters, Vol. 74, No. 8, Feb. 22, 1999.
[5] A. Fert and H. Jaffres, Conditions for Efficient Spin Injection From a Ferromagnetic Metal into a Semiconductor, Physical Review B, Vol. 64, Oct. 19, 2001.
[6] T. M. Maffitt, et al., Design Considerations for MRAM, IBM J. Res. & Dev., Vol. 50, No. 1, January 2006.
[7] S. Sugahara and M. Tanaka, A Spin Metal-Oxide-Semiconductor Field-Effect Transistor Using Half-Metalic-Ferromagnetic Contacts of the Source and Drain.
[8] M. M. Rieger and P. Vogl, Phys. Rev. B 48, 14296 (1993).
[9] J. D. Plummer et al., *Silicon VLSI Technology*, Prentice-Hall, 1$^{st}$ ed. (2000).

The entire contents of each reference listed in the above LIST OF REFERENCES are incorporated herein by reference.

Spintronics stands for "Spin Based Electrons." A spintronic device uses the intrinsic spin of the electron, in addition to or in lieu of its charge, to store and process information. Because spintronic devices might be able to represent data with far fewer electrons than conventional charge-based electronics, spintronic devices can be considerably smaller and faster than conventional microelectronics.

Moore's law is the empirical observation that the complexity of integrated circuits, with respect to minimum component cost, doubles every 24 months. To maintain this pace of growth, semiconductor devices need to become smaller.

Difficulties of semiconductor device fabrication are a limiting factor in the realization of Moore's law. Recently, the small size of conventional MOSFETs has created operational problems. Quantization of charge and energy levels become important in all materials at sizes below 10 nm. Furthermore, with small MOSFET geometries, the voltage that can be applied to the gate must be reduced to maintain reliability. To maintain performance, the threshold voltage of the MOSFET must be reduced as well. As threshold voltage is reduced, the transistor cannot be completely turned off, resulting in a weak-inversion layer which consumes power in the form of subthreshold leakage when the transistor should not be conducting. Subthreshold leakage can consume upwards of half of the total power consumption of a chip.

At present, various solutions are being developed to continue CMOS scaling beyond physical gate lengths of 20 nm (45 nm technology node). These various solutions include non-classical CMOS architectures such as multiple gate and ultra-thin body MOSFETs, as well as various technology boosters such as mobility-enhancing strained Si, elevated source/drain, high-k gate dielectrics, and metal gate electrodes.

However, when the technology node reaches a length of about 22 nm (9 nm physical gate length), more radical innovation will be required. It is presently forecasted that CMOS architecture will continue to be used as a technology platform. Thus, there is a need for novel devices that significantly enhance system performance beyond that attainable with CMOS alone.

Spintronic devices, which utilize the intrinsic electron spin, are prime candidates towards this goal and can open routes toward combined storage and logic, memory transistors, reconfigurable logic, zero standby power technologies. Furthermore, devices using electron spin contribute toward long-term prospects of quantum computing and quantum cryptography.

As semiconductors become smaller, the classical laws of electricity and magnetism begin to break down, and the laws of quantum mechanics begin to govern the interactions within the semiconductor. The rules of quantum mechanics are quite different from the classical rules that determine the properties of conventional logic gates. If computers are to become smaller in the future, new quantum technology must replace or supplement conventional technology. It has been recognized that spintronics may be a route to solid-state quantum computing.

In addition to their mass and electric charge, electrons have an intrinsic quantity of angular momentum referred to as spin. Associated with the spin is a magnetic field, like that of a tiny bar magnet lined up with the spin axis. The two states of an electron are referred to as "spin-up" and "spin-down." In the presence of a magnetic field, electrons with spin-up and spin-down have different energies. In a conventional electronic circuit, the spins of the electrons are oriented at random and have no effect on current flow. A spintronic device will create spin-polarized currents and use the spin to store or process information.

Conventional views of spin-dependent transport in non-magnetic semiconductors have mainly focused on III-V semiconductors, where the direct band-gap allows convenient optical experiments to access (i.e., read and write) the spin polarization of the carriers in the semiconductor.

Theoretical proposals for three terminal spintronic semiconductor devices have been made. Document [7], for example, makes a theoretical proposal for such a device. Document [7] assumes a half-metallic source/drain, wherein the highest occupied band is completely spin-polarized. However, there is no established room-temperature half-metallic materials yet. Thus, the present inventors have recognized that the device theorized in document [7] cannot be made with existing materials. Further, even assuming a half metallic material can be established at room temperature, such material is unlikely to be compatible with silicon or easily fabricated using existing silicon technology or modifications thereof.

Thus, the present inventors have recognized a need to move toward Si based spintronic devices, where optical experiments are no longer possible.

SUMMARY OF THE INVENTION

Accordingly, one object of the present invention is to address at least some of the above described and/or other problems of conventional semiconductor devices.

In a non-limiting embodiment of the present invention, a semiconductor device includes: a substrate comprising silicon; a channel region formed on the substrate; a spin injector formed on the substrate at a first side of the channel region and configured to diffuse a spin-polarized current into the channel region; a spin detector formed on the substrate at a second side of the channel region and configured to receive said spin polarized current from the channel region; and a gate formed on the substrate in an area of said channel region.

In another embodiment of the present invention, the spin injector includes: a ferromagnetic material, and a dielectric material interposed between the ferromagnetic material and the substrate.

In another embodiment of the present invention, the spin detector includes: a ferromagnetic material, and a dielectric material interposed between the ferromagnetic material and the substrate.

In another embodiment of the present invention, the channel region includes a heterostructure channel.

In another embodiment of the present invention, the channel region includes a layer of strained silicon formed on a virtual substrate to form an SiGe/Si heterojunction.

In another embodiment of the present invention, the channel region includes a retrograde doping structure.

In another embodiment of the present invention, the substrate includes: silicon, partially-depleted silicon-on-insulator, fully-depleted silicon-on-insulator, or virtual silicon-germanium or a combination of two or more thereof.

In another embodiment of the present invention, the gate includes: a gate electrode material; and a dielectric material interposed between the gate electrode material and the substrate, wherein the gate electrode material is one of poly-silicon and metal, and the dielectric material is one of silicon dioxide, silicon oxy-nitride, and high-k dielectric material.

In another embodiment of the present invention, the spin injector and spin detector each include a ferromagnetic metal.

In another embodiment of the present invention, the spin injector and the spin detector each include a ferromagnetic semiconductor.

In another embodiment of the present invention, the ferromagnetic metal of at least one of the spin injector and the spin detector includes Co.

In another embodiment of the present invention, the ferromagnetic material consists of Co.

In another embodiment of the present invention, wherein the spin injector comprises a fixed magnetization structure, the spin detector comprises a switchable magnetization structure, and the spin polarized current flows from the spin injector to the spin detector when the spin detector magnetization is parallel to the spin injector magnetization.

In another embodiment of the present invention, the spin polarized current does not flow from the spin injector to the spin detector when the spin detector magnetization is anti-parallel to the spin injector magnetization.

In another embodiment of the present invention, at least one of the spin injector or spin detector is included in a respective trench formed in the substrate.

In another embodiment of the present invention, at least one of the spin injector or spin detector is raised to at least partially extend above the substrate.

In another embodiment of the present invention, the at least one of the spin injector or spin detector includes: a layer of depleted n++ semiconductor formed on the substrate; a dielectric layer formed on the layer of depleted n++ semiconductor; and a ferromagnetic layer formed on the dielectric layer.

In another embodiment of the present invention, the spin detector includes a switching mechanism configured to switch a direction of a magnetization of the spin detector.

In another embodiment of the present invention, the spin injector includes: a tunnel barrier configured to maximize spin injection, wherein the tunnel barrier is selected to satisfy $r_N(l_N/\lambda_N) << r_c << r_N \cdot (\lambda_N/l_N)$, $l_N$ is a channel length in a non-magnetic semiconductor region, $\lambda_N$ is a spin diffusion length in a non-magnetic semiconductor region, $|r_N|$ is an effective resistance of the channel region, and $r_C$ is a tunneling resistance for the tunnel barrier, and $r_C$ varies with a thickness of the tunnel barrier.

In another embodiment of the semiconductor device, the dielectric material comprises silicon dioxide, silicon oxy-nitride, or a high-k material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7 describes exemplary criteria for efficient spin injection;

DETAILED DESCRIPTION OF THE PREFERRED EMBODIMENTS

Figure 1:
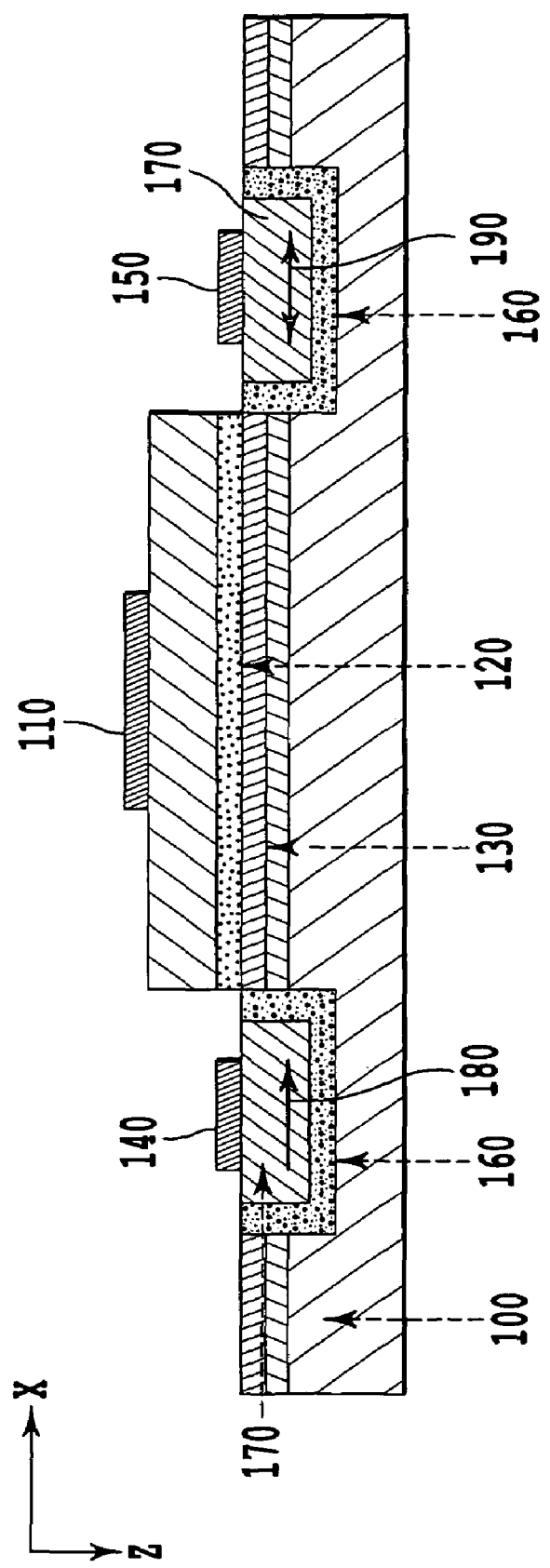
FIG. 1 is an exemplary transistor embodying the present invention.

In a non-limiting embodiment of the present invention, an all-electrical three-terminal device structure made with Si technology (and augmentations thereof, e.g., strained Si on relaxed SiGe) and which can function as both a regular field effect (i.e., charge) transistor and as a spin transistor is discussed. By simultaneously switching ON for both charge and spin flow when the gate bias is high and the source and drain magnetizations are parallel, and switching OFF when the gate voltage is low and/or the magnetizations are anti-parallel, the device can function as both a regular field effect transistor and a spin transistor.

Referring now to the drawings, wherein like reference numerals designate identical or corresponding parts throughout the several views.

There are three major prerequisites for successful spintronics implementation in semiconductors. First, there must be robust spin polarization/spin injection. Second, there must be efficient transfer across semiconductor interfaces. Third, there must be long lived spin-coherence. These three conditions will be discussed below, with reference to the exemplary embodiments of the present invention.

FIG. 1 is a non-limiting embodiment of a spintronic transistor in accordance with the present invention. The spintronic transistor shown in FIG. 1 is an all-electrical spin transport device structure based on Si/SiGe. Thus, this exemplary embodiment provides a successful transition toward Si based spintronic devices.

Si is an industry standard semiconductor. Si is a light element with small spin-orbit interaction (i.e., a small shift in energy level due to an effective magnetic field). Thus, Si has very long electron spin lifetimes.

Si is an ideal material for applications based on long spin coherence times, such as transistors with incorporated memory functionality, or quantum computing/cryptography applications.

The device shown in FIG. 1 includes substrate 100. Substrate 100 may include: silicon (Si); partially-depleted silicon-on-insulator (PDSOI); fully-depleted silicon-on-insulator (FDSOI); or virtual (relaxed) silicon-germanium (SiGe) substrate (on silicon or SOI). Exemplary embodiments of the present invention may also include a substrate including a layer of Si (depleted $n^{++}$ Si and $n^-$ Si) and a layer of SiGe.

The device shown in FIG. 1 includes gate electrode 110. For example, gate electrode 110 may be either a poly-silicon gate electrode material or a metal gate electrode material. The gate stack also includes layer 120. Layer 120 is a dielectric. For example, layer 120 may be either silicon dioxide dielectric material, silicon oxy-nitride dielectric material, or high-k dielectric material.

The channel 130 is a degenerately doped channel that is fabricated by either: retrograde doping or hetero-layer growth (e.g., strained silicon on a SiGe virtual substrate).

For a non-limiting embodiment of the present invention, the channel 130 is designed to be a heterostructure channel (strained silicon on a virtual SiGe substrate). This design was validated by Medici™ simulation. The following are the parameters of the Medici™ simulation that define the structure in the z-direction:

(i) gate work function=4.8 eV;
(ii) electrical thickness of dielectric layer 120=15 angstroms (i.e., a specific material was not selected; the physical thickness would be material dependent and chosen to give the same capacitance as 15 angstroms of $SiO_2$);
(iii) 10 nm relaxed $Si_{1-x}Ge_x$ (undoped);
(iv) 10 nm strained Si (undoped);
(v) 50 nm relaxed $Si_{1-x}Ge_x$ (N-doped to $10^{17}$ $cm^{-3}$);
(vi) 1000 nm relaxed $Si_{1-x}Ge_x$ (N-doped to $10^{16}$ $cm^{-3}$); and
(vii) bulk Si (N-doped to $10^{16}$ $cm^{-3}$).

Layers (v) and (vi) are selected to be thick enough so that they relax in spite of the lattice mismatch with the bulk. Thus, they form an $Si_{1-x}Ge_x$ substrate thereby straining the thin Si layer (iv) on top. The strained layer forms a quantum well channel, and layer (vi) is used to modulation-dope the strained channel, i.e., layer (iv). This helps to have a conductive channel while at the same time limiting spin relaxation due to ionized-impurity scattering.

In the above-described simulation x=0.4. Given a value for x, Medici™ can calculate $Si_{1-x}Ge_x$ bandstructure parameters internally. The bandstructure parameters (bandgap and electron affinity) for the strained silicon layer atop of the relaxed SiGe are not calculated by the software. The bandstructure parameters are calculated by: (a) obtaining the electron affinity for $Si_{1-x}Ge_x$ using Vegard's Law (i.e., liner interpolation between Si and Ge values), and (b) determining the conduction and valence band offsets fro a layer of strained $Si_{1-y}Ge_y$ (y=0 in this case) on a layer of relaxed $Si_{1-y}Ge_y$ from charts found in [8]. (a) and (b) immediately provide the aforementioned bandstructure parameters for the strained layer.

Figure 2A:
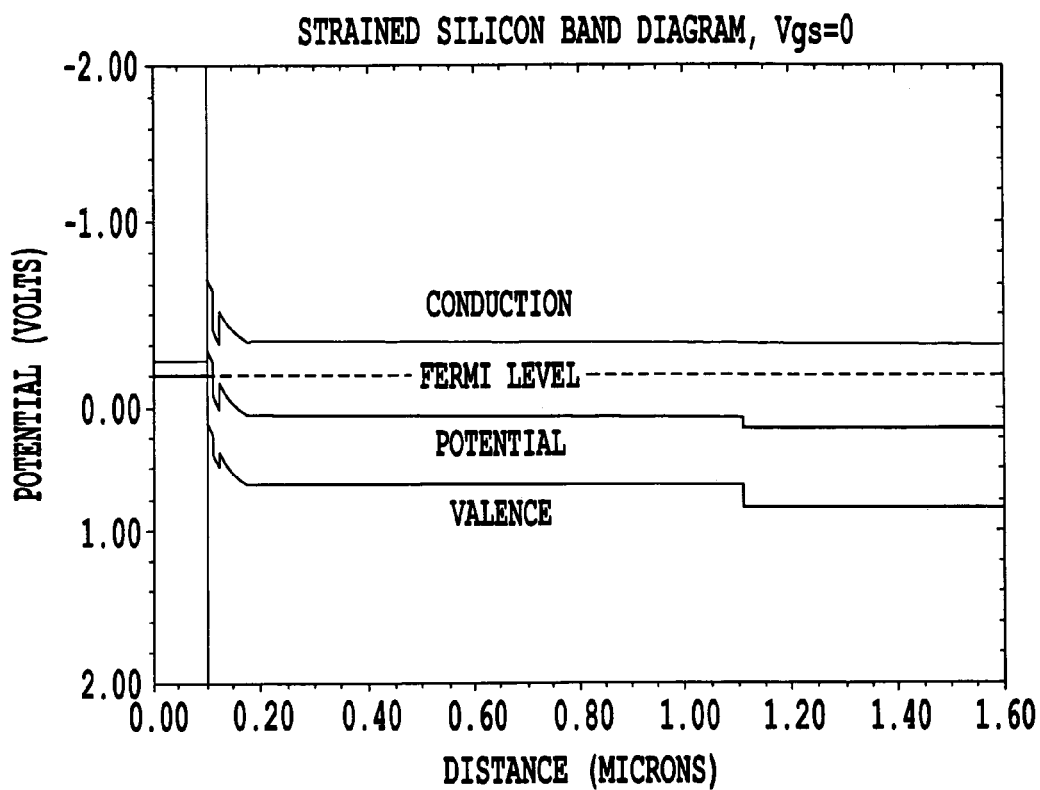
FIG. 2A is a band diagram for a transistor embodying the present invention in the low gate bias state.
Figure 2B:
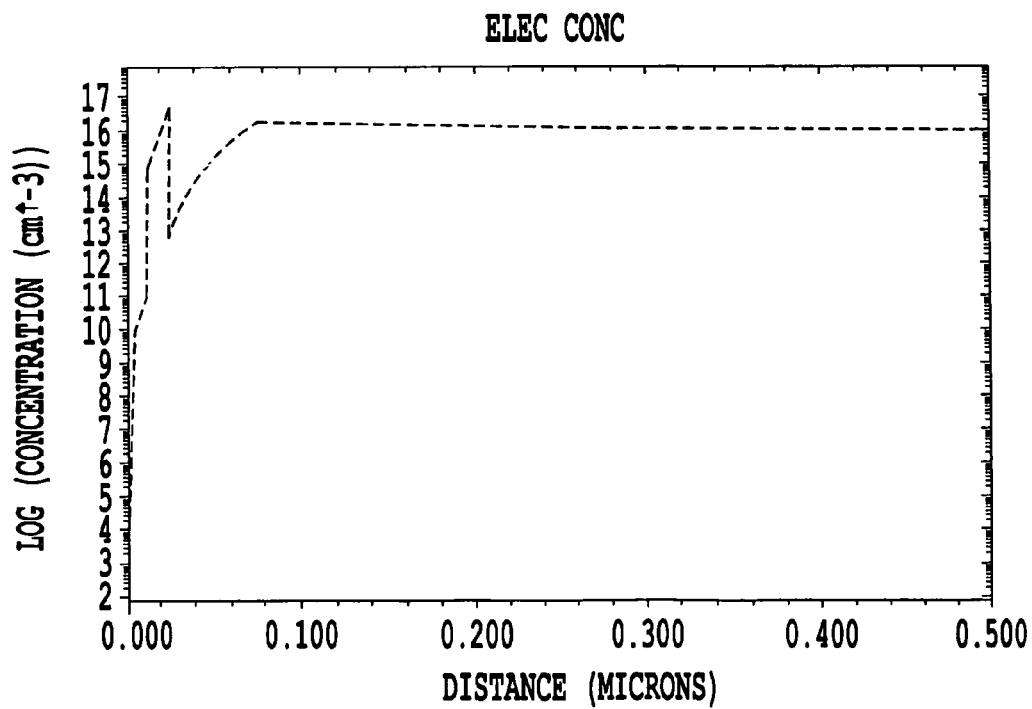
FIG. 2B is a carrier density profile corresponding to the band diagram of FIG. 2A.
Figure 3A:
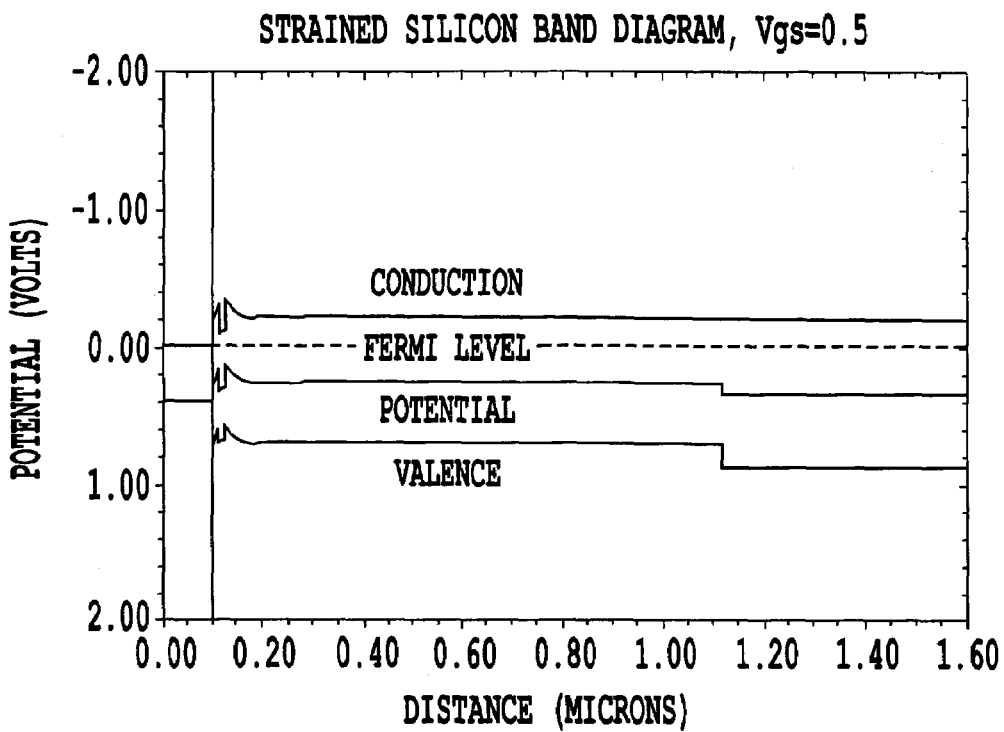
FIG. 3A is a band diagram for a transistor embodying the present invention in the high gate bias state.
Figure 3B:
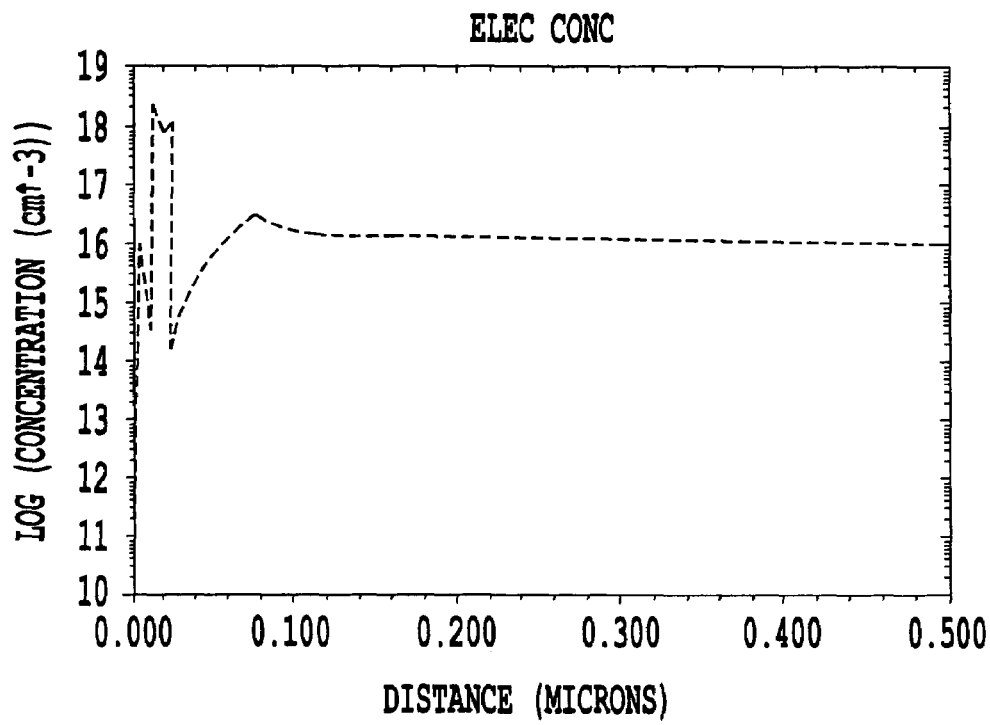
FIG. 3B is a carrier density profile corresponding to the band diagram of FIG. 3A.

As shown in FIG. 2B, when the gate bias (Vg) is zero volts, the channel region exhibits poor conductivity. As shown in FIG. 2B, the channel region (at about 0.02 microns) has an electron concentration that peaks just over 16 $cm^{-3}$. As shown in FIG. 3B, when the gate bias is 0.5 V, the channel region exhibits a much higher conductivity than when the gate voltage is zero volts. As shown in FIG. 3B, the channel region (at about 0.02 microns) has an electron concentration that peaks just over 18 $cm^{-3}$.

The channel, based on a buried SiGe/Si heterojunction, serves as both a confining layer to define the channel, and as a source of strain to lift the degeneracy of the six equivalent X-minima in the Si conduction band and influence the spin dynamics of the injected electrons. The reduced scattering in a strained channel would result in higher mobility and suppress the spin relaxation.

For spin transport in the SiGe layer, a very high Ge content (e.g., 60-90%), as well as the implementation of spin injection contacts directly on the SiGe rather than on the Si is preferred. Ge concentration and strained SiGe/unstrained Si vs. unstrained SiGe/strained Si are exemplary parameters that can be used to influence spin transport.

The channel region is a quantum well channel. It is in this narrow region (in terms of depth along the z-direction (shown in FIG. 1) that the source/drain tunnel barriers (described below) are sufficiently lowered by the application of the gate voltage. FIGS. 2B and 3B show that as the gate voltage is increased, the tunnel barrier is lowered, and the concentration of spin polarized electrons in the quantum well channel increases. However, FIGS. 2B and 3B show that the concentration of charge carriers outside of the quantum well channel do not increase when the gate bias is applied. This is because, elsewhere along the z-direction, the semiconductor region has much higher barriers. These higher barriers provide less leakage current than conventional metal source/drain MOSFET designs.

The barrier formed by dielectric 160 is almost independent of the gate bias. It is the additional thermionic barrier that differs with the gate bias. The total tunneling barrier is a conjunction of dielectric 160 and the thermionic barrier. In an exemplary quantum well channel, the thermionic barrier in the x-direction (as defined in FIG. 1) is also dependent on the position along the z-axis; specifically, whether the value of z is within the channel region or outside of the channel region. If outside the channel region, the thermionic barrier will vary somewhat, but is high for all gate voltages. It is only within a small range of z-values corresponding to the channel region that the thermionic barrier becomes relatively small for a high gate bias.

The spintronic transistor of FIG. 1 includes spin injector (source) 140 and spin detector (drain) 150. The spin injector includes FM metal 170 and dielectric 160. The spin detector also includes FM (ferromagnetic material) 170 and dielectric 160. Dielectric 160 forms a tunnel barrier between the FM 170 and the semiconductor material forming channel 130. The FM is a ferromagnetic metal or a ferromagnetic semiconductor material. Preferably the FM includes Co and/or compounds thereof. Co and Co compounds may be deposited by conventional deposition techniques. The FM 170 in the spin injector has a magnetization 180 that is fixed in one direction. The FM 170 in the spin detector includes a magnetization 190 with a direction capable of being switched. The switching of magnetization 190 will be explained below.

As shown in FIG. 1, spin injector 140 and spin detector 150 are each separated from the substrate and channel by a thin barrier of dielectric material 160. Material 160 is, for example, one of the following: silicon dioxide, silicon oxy-nitride, or a high-k material.

FM 170 and material 160 are selected so that electrons at the majority-spin Fermi level in the FM source encounter a low thermionic barrier to carrier injection in the ON state. As shown in FIG. 3A, a source/drain material with a work function of 0.1 eV more than the electron affinity of silicon would result in a negligible thermionic barrier at the high gate bias. This, combined with the high channel conductivity, can lead to a high source to drain charge current (assuming that the magnetization of the source and drain are aligned). Because of band bending, a low gate voltage would result in a larger thermionic barrier for the same material (see FIG. 2A). This, in conjunction with the poor channel conductivity, leads to a low source to drain charge current.

In a non-limiting embodiment of the present invention, the spin injector and spin detector are formed from a layer of depleted $n^{++}$ Si formed on the substrate, an $SiO_2$ dielectric layer formed on the depleted $n^{++}$ Si layer, and a Co layer (i.e., a ferromagnetic layer) formed on the $SiO_2$ layer.

Figure 5:
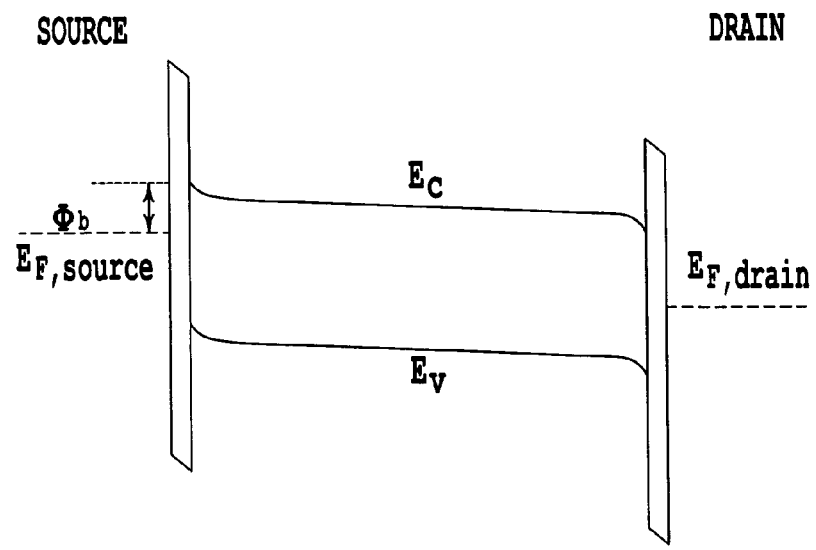
FIG. 5 is a band diagram along the x-axis of the channel region in the low gate bias state.

FIG. 5 shows schematic band diagram along the x-axis between the source and the drain of the semiconductor device of FIG. 1. As shown in FIG. 5, when the gate bias is low, a large potential barrier exists between the source and drain. Φ indicates the thermionic barrier height at the interface.

Figure 6:
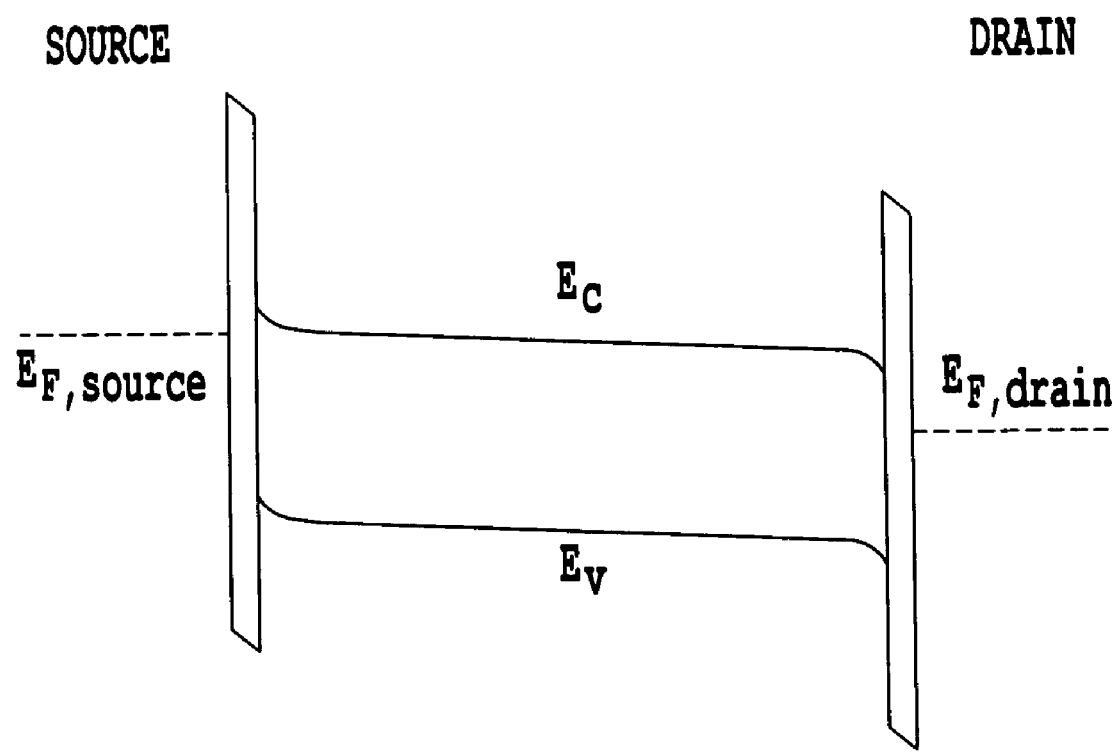
FIG. 6 is a band diagram along the x-axis of the channel region in the high gate bias state.

In contrast to FIG. 5, FIG. 6 shows a schematic band diagram along the x-axis between the source and the drain when the gate is at a high bias. As shown in FIG. 6, the potential barrier between the source and drain is smaller and the thermionic barrier is negligible (as compared to FIG. 5), which results in a higher charge carrier density in the channel region.

The FM source/drain regions of the present invention are contrary to conventional MOS transistors. Conventional MOS transistors have doped semiconductor source/drain regions that are doped opposite to that of the substrate or body (e.g., n-type source/drain regions if the body is p-type material). A reversed biased p-n junction, formed in the conventional MOS transistor, results in a low source drain current when the transistor is in the OFF state (i.e., a low gate bias).

Figure 4:
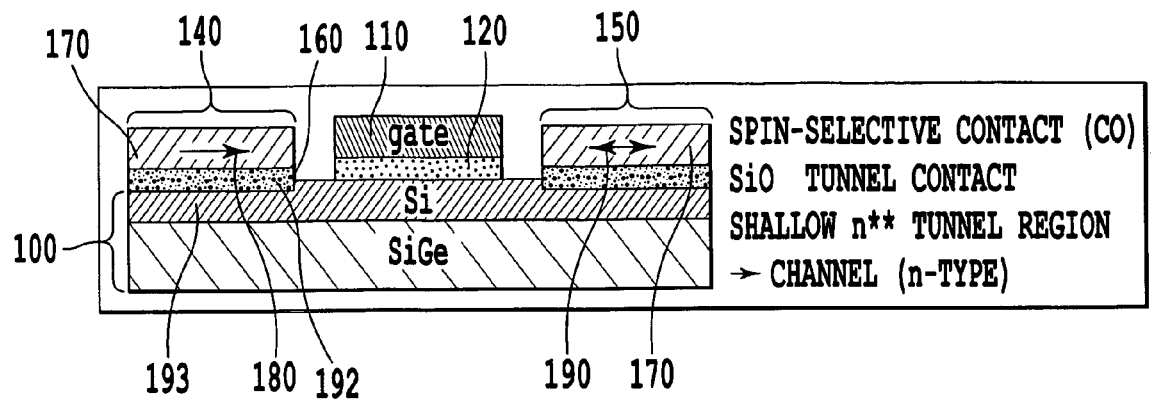
FIG. 4 is another exemplary transistor embodying the present invention.

As shown in FIG. 1, the FM source/drain regions may be formed by etching a trench in the substrate and filling the substrate in with the FM. This effectively replaces conventional semiconductor source/drain regions. Alternatively, the metal source/drain regions may be raised as are more commonly seen in conventional fully-depleted silicon-on-insulator (FDSOI) devices. An exemplary transistor, with raised metal source/drain regions, is shown in FIG. 4. FIG. 4 shows an exemplary spintronic transistor that includes the following stack: $CO/SiO2/depleted$ $n^{++}$ $Si/n^-$ $Si/strained$ $SiGe$, wherein the edge of the depletion layer coincides with the metallurgical junction between the $n^{++}$ 192 and $n^-$ 193 regions.

The exemplary transistor in FIG. 1 includes two magnetic tunnel contacts. The first magnetic tunnel contact is the spin injector 140, and the second magnetic tunnel contact is the spin detector 150. Magnetic tunnel contacts are a robust and reliable way towards the electrical injection and detection of spin-polarized electrons. The spin-dependent density of states in ferromagnetic metals or ferromagnetic semiconductors provides the necessary spin selectivity up to high temperatures. In a magnetized ferromagnetic material, the energy of one spin polarization is shifted higher with respect to the other. A current resulting from the magnetized ferromagnetic material is spin polarized because more electrons near the Fermi level are in one spin state than the other. For example, the Curie temperatures of Fe and Co are 770° C. and 1130° C., respectively. The Curie temperature corresponding to a ferromagnetic material is the temperature below which the material is ferromagnetic. Above the Curie temperature, the magnetic ordering vanishes. Thus, the Curie temperature is the critical temperature of this phase transistion.

Document [2] further describes spin injection from a junction formed by ferromagnetic metal, a tunnel barrier (i.e., dielectric), and a normal conductor. The tunnel barriers allow for efficient spin injection from the metal into the semiconductor. The tunnel barrier is spin selective, i.e., has different conductivities for up and down spins. Document [5] further explains how the inclusion of a tunnel barrier between the metal and semiconductor influences the spin polarization of the injected current.

There are metal (usually silicide) source/drain conventional MOSFETs where a Schottky barrier exists between the metal and semiconductor. Such a device is described in document [4]. However, a Schottky barrier (or Ohmic contact) would not inject a spin-polarized current. Thus, dielectric 160, shown in FIG. 1, replaces the Schottky barrier of conventional MOSFETs.

The tunnel barrier also provides the necessary matching in conductance between the magnetic contact and the semiconductor. A huge difference in conductivity between a ferromagnetic metal and a semiconductor precludes efficient spin injection from one into the other. Furthermore, the tunnel barrier forms a chemical barrier between the metal and the semiconductor, which improves the thermodynamic stability of the contact.

In an exemplary embodiment of the present invention, the tunnel barrier is formed by the ferromagnetic metal Co in combination with $SiO_2$ (an exemplary selection for dielectric 160). Co (with work function 5.0V) is a familiar material in conventional-CMOS technology (although mostly in the form of $CoSi_2$). Co is stable in contact with $SiO_2$ (i.e., there is no tendency to decompose the $SiO_2$ and form either CoO or $CoSi_2$). When Co is placed in contact with Si, the chemical potential in the materials will align with each other. The chemical potential in a semiconductor is doping-dependent. The band-bending at the interface is the difference in the work functions. The band-bending determines if, and how easily, carriers might be injected from one material into the other. For example, the band-bending might create a (Schottky) barrier that inhibits carrier injection.

Important considerations when designing the tunnel barriers are the electric quality of the tunnel barriers and the magnetic quality of the magnetic tunnel contacts (e.g., the interface spin polarization of the Co/oxide interface, and the absence of spin-flip scattering at the oxide/semiconductor interface).

Dangling bonds in Si have unpaired electrons, which might result in spin-flip scattering. Thus, in one exemplary embodiment of the present invention, $SiO_2$/Si interfaces, which can essentially be passivated perfectly, are employed. The thicknesses of the $SiO_2$/Si interfaces are scaled down to smaller thickness (i.e., 8-12 angstroms) to allow tunneling. Determination of the thickness of the tunnel barrier will be explained below.

High magnetoresistance in ferromagnet/barrier/non-magnet/barrier/ferromagnet structures is achieved when: $r_N(l_N/\lambda_N) \ll r_c \ll r_N \cdot (\lambda_N/l_N)$ (i.e., efficient spin injection condition), where $l_N$ is the length of the non-magnet (N) region (i.e. channel length) and $\lambda_N$ is the spin diffusion length in the N region, and $$r_N = \frac{\lambda_N}{\sigma_N}$$

is its effective resistance ($\sigma_N$ being the conductivity of the N region), and $r_C$ is the tunneling resistance for the source/drain barriers. Considering, as a typical example, $l_N \sim 50$ nm and $\lambda_N \sim 1000$ nm, the above criterion translates to $0.05 r_N \ll r_c \ll 20 \cdot r_N$. Imposing an even stricter inequality provides the following rule for designing the source/drain tunnel barriers: $0.5 r_N < r_C < 2 r_N$. This inequality is satisfied for the ON state. However, this inequality is not satisfied for the OFF state. In the OFF state, $r_N^{off} \approx 100 \cdot r_N^{on}$. This is further illustrated in FIG. 7.

From FIGS. 2B and 3B, we see that the ratio of the carrier density in the channel between the ON and OFF states is about 100. Therefore, $\sigma_N$ should also be about two orders of magnitude larger in the ON state than in the OFF. Then the ON and OFF state channel resistances are related as follows: $r_N^{off} \approx 100 \cdot r_N^{on}$. The source/drain tunnel barrier thickness is chosen so that $0.5 r_N^{on} < r_C < 2 r_N^{on}$ and high magnetoresistance is realized in the ON state; the inequality is then not satisfied for $r_N^{off}$, and we do not have efficient spin injection in the OFF-state. Thus, the device would have a high magnetoresistance in the ON state (i.e., dependence of the current on the relative orientation of the magnetizations in the source and drain) but not in the OFF state (e.g., no dependence of the current on the relative orientation of the magnetizations in the source and drain). In the OFF state, the transistor passes a small leakage current with no appreciable magnetoresistance.

Several variables enter the calculation to determine how thick the tunnel barriers (i.e., the dielectric 160) should be. These variables include:

- the spin-dependent chemical potentials in the ferromagnetic source;
- the barrier height (i.e., the barrier can be assumed to be rectangular);
- that spin-up and spin-down carriers see the same type of barrier; (i.e., both spin-up and spin-down carriers tunnel into propagating states in the semiconductor on the other side of the barrier);
- the electronic structure parameters of the materials, e.g., the effective mass (i.e., the effective mass can be assumed to be constant throughout); and
- geometrical parameters.

Below, it is shown for realistic parameters, that the efficient spin injection condition can be satisfied. For this example, the condition will be strengthened to show a strict inequality for designing the tunnel barrier:

$$10 \cdot r_N \cdot (l_N/\lambda_N) < r_c < 0.1 \cdot r_N \cdot (\lambda_N/l_N) \tag{1}$$

For a channel concentration in the ON state of $n \sim 10^{20}$ cm$^{-3}$, the conductivity is $$\sigma_N^{on} \approx ne\mu = 10^{20} \cdot 1.6 \cdot 10^{-19} \text{ C} \cdot 1000 \text{ cm}^2 \text{V}^{-1} \text{s}^{-1} \approx 10^4 \text{ } (\Omega \cdot \text{cm})^{-1}, \tag{2}$$

where e is the charge of an electron and μ is the electron mobility.

For channel length $l_N \sim 30$ nm and spin relaxation length $\lambda_N \sim 1000$ nm, $$r_N^{on} = \frac{\lambda_N}{\sigma_N} \approx 10^{-8} \Omega \cdot \text{cm}^2. \tag{3}$$

Inequality (1) may be rewritten as $$0.3 \sim r_N^{on} < r_c < 3.33 \cdot r_N^{on} \tag{4}$$

$\sigma_N^{off}$ and $r_N^{off}$ are significantly lower than the corresponding ON quantities, so that condition (4) is not satisfied in the OFF state.

The tunnel barrier contact resistance is defined as:

$$r_c = \frac{\sum_\uparrow + \sum_\downarrow}{4 \sum_\uparrow \sum_\downarrow}, \tag{5}$$

wherein $\Sigma_\uparrow$, $\Sigma_\downarrow$ are the spin-up and spin-down contact conductance per unit area. From Landauer-Buttiker theory, we approximate the spin contact conductance per unit area by:

$$\sum = \frac{e^2 m^*}{h \pi \hbar^2} T(\zeta) \cdot k_B T, \tag{6}$$

wherein e is the electronic charge, h is the Planck constant, $\hbar = h/2\pi$, $T(\zeta)$ is the energy-dependent tunneling probability, $m^* \approx 0.5$ m the effective mass, and $k_B T$ is the thermal energy range. It is assumed that the tunneling probability is constant within this thermal energy range below the chemical potential, and is negligible for lower energies.

Using the WKB approximation, we write the tunneling probability as:

$$T \approx \exp(-2\kappa b), \tag{7}$$

where $$\kappa(E) = \sqrt{\frac{2m^*(V-E)}{\hbar^2}}$$

and b is the barrier thickness. We choose $V - E_\downarrow = 2$ eV and $V - E_\uparrow = 2.5$ eV (for comparison, a Si/SiO2/Si system with degenerate silicon gives V−E=3 eV for electrons) to get $\kappa_\downarrow$ and $\kappa_\uparrow$. Substituting into equation (7), and assuming a barrier thickness b≈1 nm, we get $T_\uparrow$ and $T_\downarrow$, and from equation (6) we get $\Sigma_\uparrow$ and $\Sigma_\downarrow$.

Finally, from equation (5), we get:

$$r_c \sim 10^{-8} \, \Omega \cdot cm^2 = r_N, \quad (8)$$

which satisfies the condition in inequality (4). Variation in the channel conductivity from the typical values used here can be easily accommodated, while still maintaining efficient spin injection, by slightly adjusting the barrier thickness since the barrier contact resistance depends exponentially on it.

Figure 8:
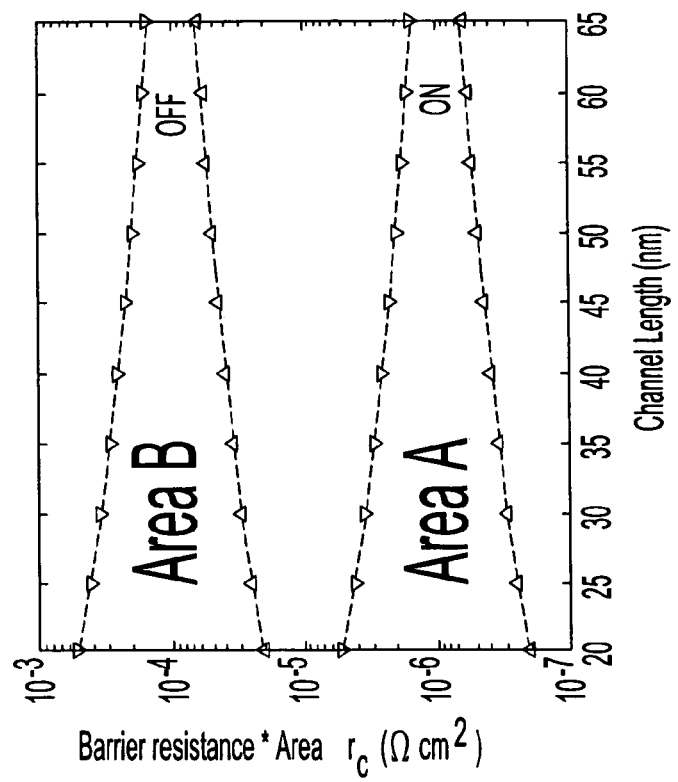
FIG. 8 is a graph of the boundaries for the efficient spin injection inequality for the ON state and the OFF state.

FIG. 8 is a graph of the boundaries for the efficient spin injection inequality for the ON state and the OFF state. The graph in FIG. 8 is a plot of the lower and upper bounds for the ON state and OFF state obtained from inequality (1). The graph shows a plot of barrier resistance multiplied by area vs. channel length ($l_N$). The conductivity of the channel region is different in the ON state and the OFF state (i.e., high and low gate biases respectfully). Inequality (1), written for both the ON state and OFF state results in:

$$10 \cdot [r_N^{on} \cdot (l_N/\lambda_N)] < r_c < 0.1 \cdot [r_N^{on} \cdot (\lambda_N/l_N)] \quad (9) \text{ (for the ON state) and}$$

$$10 \cdot [r_N^{off} \cdot (l_N/\lambda_N)] < r_c < 0.1 \cdot [r_N^{off} \cdot (\lambda_N/l_N)] \quad (10) \text{ (for the OFF state).}$$

$r_c$ is chosen to satisfy inequality (9), but not inequality (10). Thus, a value for $r_c$ is chosen that lies in the region between the two curves labeled ON (herein referred to as area A), but not in the region between the curves labeled OFF (herein referred to as area B). In general, the tunnel barrier is designed to be in the portion of area A that does not intersect with area B. In the example shown in FIG. 8, this is easily accomplished because the ON and OFF regions do not intersect (i.e., A–B=null). The ON and OFF regions do not intersect because of the large difference in conductivity between the ON and OFF states.

Operation of an exemplary embodiment of the present invention will be made with reference to FIG. 1. In this embodiment, the device has C source/drains, dielectric layer 120 is a high-k dielectric, the gate electrode is metal, dielectric layer 160 (i.e., the source/drain injection barrier) is silicon dioxide or silicon-oxynitride, and the channel is a modulation-doped Si/SiGe based quantum well channel. To allow tunneling, dielectric layer 160 is specifically chosen not to be a high-k dielectric.

When zero voltage is applied to gate 110, the tunnel barrier is sufficiently thick to prevent electrons from FM 160 from tunneling into channel region 130. Thus, when the gate bias is zero, channel 130 is designed to be OFF (i.e., no spin-polarized current flows through the channel) when the gate bias is small. When the gate bias is sufficiently large, and the magnetization 180 and 190 of the drain and the source are parallel, the transistor is considered ON (i.e., spin-polarized current flows from the source to the drain). The source/drain current (which is a spin-polarized current) is injected through tunnel barriers 160. When the gate bias voltage is high, but the magnetizations 180 and 190 of the source and drain are anti-parallel, the transistor is OFF (i.e., no spin-polarized current flow through the channel).

During operation of the spintronic transistor, a magnetization of the drain is parallel or anti-parallel to that of the source. This could be implemented as in an MRAM or by other magnetization switching techniques. Details of MRAM technology are provides in reference [6] incorporated herein. In the OFF state, the transistor passes a small, i.e. 'leakage', charge current with no appreciable magnetoresistance (that is, no dependence of the current on the relative orientation of the magnetizations in the source and drain). In the ON state, the device passes a high spin-polarized current when the source and drain magnetizations are parallel, but it passes a low current when they are anti-parallel since this is also a high-magnetoresistance configuration. Thus, in the parallel configuration, a non-limiting embodiment of the device shown in FIG. 1 can be used as a "charge transistor." A non-limiting embodiment of the device shown in FIG. 1 can also provide non-volatile memory functionality as a "spin transistor" whose state can be read by measuring the source to drain current after switching the "spin transistor" ON.

Figure 9:
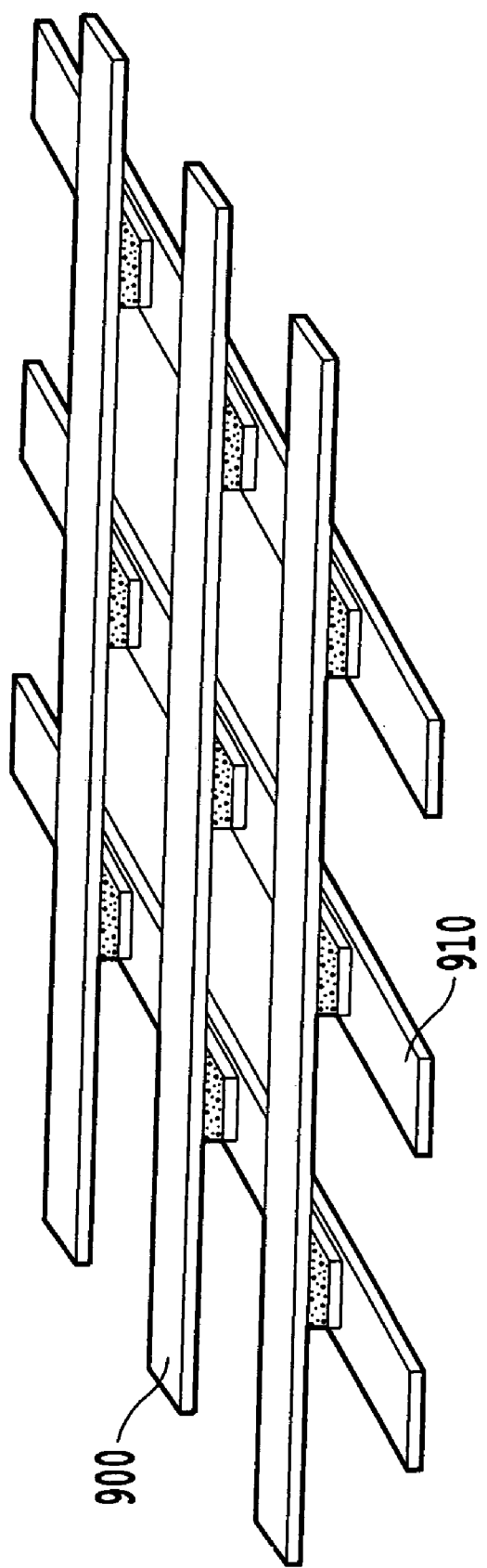
FIG. 9 is an exemplary structure configured to switch the magnetization in the spin detector.

FIG. 9 shows an exemplary structure of metal wires that switch the direction of the magnetization of the spin detector. During a write operation, a current is forced along a line 900 and a line 910. The currents create a magnetic field, whose vector sum is sufficient to switch the direction of the magnetization of the FM in the spin detector.

Thus, a spintronic transistor embodying the present invention is capable of performing a logical operation (i.e., ON/OFF) by utilizing the spin of the electrons.

Furthermore, a spintronic transistor embodying the present invention is capable of being used as a non-volatile memory device. Each spintronic transistor can store one bit of information. Information can be stored in the unpinned ferromagnetic material of the drain even if the power is turned off. In addition, since the spintronic transistor does not need to be updated continuously, power consumption is much lower than conventional transistors.

Performing a function as a memory, a non-limiting embodiment of the present invention can store either a zero or a one. To perform read operation on the spintronic transistor, a bias is applied to the gate. If a current is detected at the drain, then the magnetization of the source and drain are parallel, and this can represent a 1. If no current is detected at the drain, then the magnetizations of the source and drain are anti-parallel, and this can represent a zero.

Furthermore, spintronic devices can represent data with far fewer electrons than conventional charge-based electronics. Accordingly, spintronic devices are considerably smaller and faster than conventional microelectronics.

Furthermore, the function of spintronic transistor embodying the present invention, could be changed "on the fly" by changing the magnetization of the FM in the drain (or even the source). Processors using a spintronic transistor embodying the present invention could readjust mid-clock cycle by reversing the magnetization of some of its elements in order to do calculations more efficiently. This allows an entirely new approach to computing, which is software driven (rather than hardware-determined), and a standardized reprogrammable logic chip would become a universal microprocessor.

As described above, the magnetization of the spin detector (i.e., the drain) is either parallel to or anti-parallel to the magnetization of the spin injector (i.e., the source). In an exemplary embodiment of the present invention, the switching of the magnetization in the drain is implemented as in an MRAM or by other magnetization switching techniques. For example, the switching is performed with a global static magnetic field that switches the drain magnetization but not that of the source. This is achieved by shaping the source/drain regions differently, so that one region switches magnetization at a lower magnetic field than the other region. In another exemplary embodiment of the present invention, the semiconductor device would include metal lines addressing the drain as in an MRAM (see document [6]). The magnetic field due to the current in these metal lines will switch the relative magnetization of the drain. The source magnetization is held fixed, for example, by using an anti-ferromagnetic pinning layer.

Furthermore, other schemes can be used to switch the relative magnetization of the drain, such as current-driven magnetization reversal.

Furthermore, spintronic devices embodying the present invention can use both electric and magnetic fields to control the spin polarized current.

Still further, spintronic devices embodying the present invention can be fabricated using well known Si device fabrication techniques.

Semiconductor devices embodying the present invention can be fabricated using the standard CMOS process flow described in document [9]. This device fabrication would follow the sequence described above with reference to the Medici simulation, with the addition of the following, well established, process steps for the source/drain and channel regions:

(I) epitaxial layers (iii), (iv), and (v) noted above are grown by chemical vapor deposition (CVD);
(II) trenches are etched to define source/drain regions;
(III) oxidation and/or deposition of dielectric 160 so that it covers the surface including that of the trenches;
(IV) filling the trenches with ferromagnetic source/drain material; and
(V) polishing the surface to remove dielectric 160 and metal from regions other than the source/drain.

Clearly, numerous modifications and variations of the present invention are possible in light of the above teachings. It is therefore to be understood that within the scope of the appended claims, the invention may be practiced otherwise than as specifically described herein.

The invention claimed is:

1. A semiconductor device comprising:
a substrate comprising silicon;
a channel region formed on the substrate;
a spin injector formed on the substrate at a first side of the channel region and configured to diffuse a spin-polarized current into the channel region;
a spin detector formed on the substrate at a second side of the channel region and configured to receive said spin polarized current from the channel region; and
a gate formed on the substrate in an area of said channel region,
wherein the channel region comprises a SiGe/Si heterostructure channel that serves as both a confining layer to define the channel and as a source of strain to lift a degeneracy in a Si conduction band and to influence spin dynamics of injected electrons.

2. The semiconductor device of claim 1, wherein the spin injector comprises:
a ferromagnetic material, and a dielectric material interposed between the ferromagnetic material and the substrate.

3. The semiconductor device of claim 1, wherein the spin detector comprises:
a ferromagnetic material, and a dielectric material interposed between the ferromagnetic material and the substrate.

4. A semiconductor device comprising:
a substrate comprising silicon;
a channel region formed on the substrate;
a spin injector formed on the substrate at a first side of the channel region and configured to diffuse a spin-polarized current into the channel region;
a spin detector formed on the substrate at a second side of the channel region and configured to receive said spin polarized current from the channel region; and
a gate formed on the substrate in an area of said channel region,
wherein the channel region comprises a retrograde doping structure.

5. The semiconductor device of claim 1, wherein the substrate comprises silicon, partially-depleted silicon-on-insulator, fully-depleted silicon-on-insulator, or virtual silicon-germanium or a combination of two or more thereof.

6. The semiconductor device of claim 1, wherein the gate comprises:
a gate electrode material; and
a dielectric material interposed between the gate electrode material and the substrate, wherein
the gate electrode material is one of poly-silicon and metal, and
the dielectric material is one of silicon dioxide, silicon oxy-nitride, and high-k dielectric material.

7. The semiconductor device of claim 1, wherein the spin injector and spin detector each comprise a ferromagnetic metal.

8. The semiconductor device of claim 1, wherein the spin injector and spin detector each comprise a ferromagnetic semiconductor.

9. The semiconductor device of claim 7, wherein the ferromagnetic metal of at least one of the spin injector and the spin detector comprises Co.

10. The semiconductor device of claim 9, wherein the ferromagnetic material consists of Co.

11. The semiconductor device of claim 1, wherein
the spin injector comprises a fixed magnetization structure,
the spin detector comprises a switchable magnetization structure, and
the spin polarized current flows from the spin injector to the spin detector when the spin detector magnetization is parallel to the spin injector magnetization.

12. The semiconductor device of claim 11, wherein
the spin polarized current does not flow from the spin injector to the spin detector when the spin detector magnetization is anti-parallel to the spin injector magnetization.

13. The semiconductor device of claim 1, wherein at least one of the spin injector or spin detector is included in a respective trench formed in the substrate.

14. The semiconductor device of claim 1, wherein at least one of the spin injector or spin detector is raised to at least partially extend above the substrate.

15. The semiconductor device of claim 1, wherein the at least one of the spin injector or spin detector comprises:
a layer of depleted n++ semiconductor formed on the substrate;
a dielectric layer formed on the layer of depleted n++ semiconductor; and
a ferromagnetic layer formed on the dielectric layer.

16. The semiconductor device of claim 11, wherein the spin detector comprises:
a switching mechanism configured to switch a direction of a magnetization of the spin detector.

17. The semiconductor device of claim 1, the spin injector comprises:
a tunnel barrier configured to maximize spin injection, wherein the tunnel barrier is selected to satisfy $r_N(l_N/\lambda_N) \ll r_c \ll r_{N'}(\lambda_N/l_N)$, $l_N$ is a channel length in a non-magnetic semiconductor region, $\lambda_N$ is a spin diffusion length in a non-magnetic semiconductor region, $r_N$ is an effective resistance of the channel region, and $r_C$ is a tunneling resistance for the tunnel barrier, and $r_C$ varies with a thickness of the tunnel barrier.

18. The semiconductor device of claim 2, wherein the dielectric material comprises silicon dioxide, silicon oxynitride, or a high-k material.

19. The semiconductor device of claim 1, wherein the semiconductor device is configured to function as a charge transistor and a spin transistor, and if a voltage applied to the gate is high and the magnetizations of the spin injector and spin detector are parallel, then the channel region passes a high spin polarized current, if the voltage applied to the gate is high and the magnetizations of the spin injector and spin detector are anti-parallel, then the channel region passes a low current and if the voltage applied to the gate is low and the magnetizations of the spin injector and spin detector are anti-parallel, then the channel region passes a low current.

\* \* \* \* \*